(12) United States Patent
Wang et al.

(10) Patent No.: US 11,612,060 B2
(45) Date of Patent: Mar. 21, 2023

(54) DISPLAY DEVICE

(71) Applicants: Chengdu BOE Optoelectronics Technology Co., Ltd., Chengdu (CN); BOE Technology Group Co., Ltd., Beijing (CN)

(72) Inventors: Kang Wang, Beijing (CN); Jiaxiang Zhang, Beijing (CN); Xiaoxia Liu, Beijing (CN); Junhui Yang, Beijing (CN); Fuzheng Xie, Beijing (CN); Xiaodong Hao, Beijing (CN); Haotian Yang, Beijing (CN); Yang Zhou, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 87 days.

(21) Appl. No.: 17/270,503

(22) PCT Filed: May 22, 2020

(86) PCT No.: PCT/CN2020/091928
§ 371 (c)(1),
(2) Date: Feb. 23, 2021

(87) PCT Pub. No.: WO2021/232438
PCT Pub. Date: Nov. 25, 2021

(65) Prior Publication Data
US 2022/0192027 A1   Jun. 16, 2022

(51) Int. Cl.
*H05K 1/18* (2006.01)
*H05K 5/00* (2006.01)
(52) U.S. Cl.
CPC ........... *H05K 1/189* (2013.01); *H05K 5/0069* (2013.01); *H05K 2201/10128* (2013.01)

(58) Field of Classification Search
CPC ................. H05K 1/189; H05K 5/0069; H05K 2201/10128
(Continued)

(56) References Cited

U.S. PATENT DOCUMENTS 11,163,334 B2 * 11/2021 Kang .................... H04M 1/185
2015/0253882 A1 * 9/2015 Lee ........................ G06F 3/0446
345/173
(Continued)

FOREIGN PATENT DOCUMENTS

| CN | 109375436 A | 2/2019 | |
| CN | 111105709 A * | 5/2020 | ............... C09J 7/00 |
| JP | 2012242698 A | 12/2012 | |

OTHER PUBLICATIONS

European Search Report for corresponding EP 20900679.0 dated Oct. 12, 2022.

*Primary Examiner* — Binh B Tran
(74) *Attorney, Agent, or Firm* — ArentFox Schiff LLP; Michael Fainberg

(57) ABSTRACT

The present disclosure relates to the technical field of display, and discloses a display device. The display device includes: a display module having a module body and a first bonding portion located on one side of a first long edge of the module body, where the first bonding portion is bent to the back face of the module body; and a first flexible printed circuit located on the back face of the module body, where the first flexible printed circuit has a second bonding portion, and the second bonding portion is fixedly connected to the first bonding portion of the display module; the length of the second bonding portion along an extending direction of the first long edge is substantially identical with the length of the first bonding portion along the extending direction of the first long edge.

12 Claims, 3 Drawing Sheets

(58) Field of Classification Search
USPC .......................................................... 361/749
See application file for complete search history.

(56) References Cited

U.S. PATENT DOCUMENTS

2018/0211587 A1  7/2018  Yu et al.
2020/0409203 A1  12/2020  Xu

\* cited by examiner

DISPLAY DEVICE

CROSS-REFERENCE TO RELATED APPLICATIONS

This application is a National Stage of International Application No. PCT/CN2020/091928, filed on May 22, 2020, which is hereby incorporated by reference in its entirety.

FIELD

The present disclosure relates to the technical field of display, in particular to a display device.

BACKGROUND

At present, the narrow bezel of an active-matrix organic light-emitting diode (AMOLED) screen module has gradually become the mainstream.

SUMMARY

The present disclosure discloses a display device.

The display device includes: a display module including a module body and a first bonding portion located on a side of a first long edge of the module body, where the first bonding portion is configured to be bent to a back face of the module body; and a first flexible printed circuit located on the back face of the module body, where the first flexible printed circuit includes a second bonding portion, and the second bonding portion is fixedly connected to the first bonding portion of the display module; and a length of the second bonding portion along an extending direction of the first long edge is substantially identical with a length of the first bonding portion along the extending direction of the first long edge.

Optionally, along the extending direction of the first long edge, a distance between an end part edge of the second bonding portion and a corresponding end part edge of the first bonding portion is less than or equal to 4.5 mm.

Optionally, along the extending direction of the first long edge, an end part edge of the first bonding portion and a corresponding end part edge of the second bonding portion are aligned, or an end part edge of the first bonding portion exceeds a corresponding end part edge of the second bonding portion.

Optionally, the first bonding portion and the second bonding portion are overlapped; along the extending direction of the first long edge, overlapped parts of the first bonding portion and the second bonding portion include extension regions located on two ends and a bonding region in the middle, and only the bonding region is provided with a connecting terminal; and the first bonding portion and the second bonding portion are connected in a bonding manner in the bonding region.

Optionally, the display device further includes: a conductive rubber layer located between the second bonding portion and the first bonding portion and configured to adhere the overlapped parts of the first bonding portion and the second bonding portion.

Optionally, the module body includes a function hole, and the function hole is close to a first end of the first long edge; and an end part edge, close to the first end of the first long edge, of the first bonding portion is configured as a wedge-shaped edge avoiding the function hole.

Optionally, a distance between the wedge-shaped edge and the function hole is greater than or equal to 1 mm.

Optionally, the display device further includes: a second flexible printed circuit connected to an edge of a second long edge of the module body in a bonding manner and configured to be bent to the back face of the module body; where the second long edge of the module body and the first long edge are disposed oppositely; the second flexible printed circuit includes a first connection portion, and the first connection portion is in inserted connection with the first flexible printed circuit by a connector.

Optionally, the second flexible printed circuit further includes a device portion; the second flexible printed circuit is provided with a groove between the device portion and the first connection portion, and the groove is configured to separate the device portion from the first connection portion.

Optionally, the device portion includes an integrated circuit chip.

Optionally, the first flexible printed circuit is L-shaped or T-shaped and includes a first extension portion and a second extension portion; the first extension portion extends along the first long edge of the module body and is connected to the first bonding portion; one end of the second extension portion is connected to the first extension portion and the other end extends in a direction away from the first extension portion; the second flexible printed circuit is located between the first extension portion and the second extension portion, the device portion and the first connection portion are arranged and adjacent along an extending direction of the second long edge, and the first connection portion is in inserted connection with the first extension portion; and the groove is a U-shaped through-groove with an opening departing from the second long edge.

Optionally, the first flexible printed circuit is a master control flexible printed circuit; and the second flexible printed circuit is a touch-control flexible printed circuit.

Optionally, the first flexible printed circuit is L-shaped or T-shaped, and includes a first extension portion and a second extension portion; the first extension portion extends along the first long edge of the module body and is connected to the first bonding portion; one end of the second extension portion is connected to the first extension portion, and the other end extends in a direction away from the first extension portion; one end, away from the first extension portion, of the second extension portion is configured as a second connection portion, and the second connection portion exceeds the second long edge of the module body and is electrically connected to a test fixture; and the second long edge of the module body and the first long edge are disposed oppositely.

A display device includes: a display module including a module body and a first bonding portion located on a side of a first long edge of the module body, where the first bonding portion is configured to be bent to the back face of the module body; the module body has a function hole, and the function hole is close to a first end of the first long edge; the end part edge, close to the first end of the first long edge, of the first bonding portion is configured as a wedge-shaped edge avoiding the function hole.

A display device includes: a display module including a module body and a first bonding portion located on one side of a first long edge of the module body, where the first bonding portion is configured to be bent to the back face of the module body; a first flexible printed circuit located on the back face of the module body, where the first flexible printed circuit has a second bonding portion, and the second bonding portion is fixedly connected to the first bonding portion of the display module; and a second flexible printed circuit connected to the edge of a second long edge of the module body in a bonding manner and configured to be bent to the back face of the module body; the second long edge of the module body and the first long edge are disposed oppositely; where the second flexible printed circuit includes a first connection portion and a device portion, and the first connection portion is in inserted connection with the first flexible printed circuit by a connector; the second flexible printed circuit is provided with a groove between the device portion and the first connection portion, and the groove is configured to separate the device portion from the first connection portion.

DETAILED DESCRIPTION OF THE EMBODIMENTS

The technical solutions in embodiments of the present disclosure will be clearly and fully described in combination with the drawings in the embodiments of the present disclosure. Obviously, the described embodiments are merely some embodiments of the present disclosure, not all embodiments. Based on the embodiments of the present disclosure, all other embodiments obtained by those of ordinary skill in the art without contributing creative efforts fall into the protection scope of the present disclosure.

Figure 1:
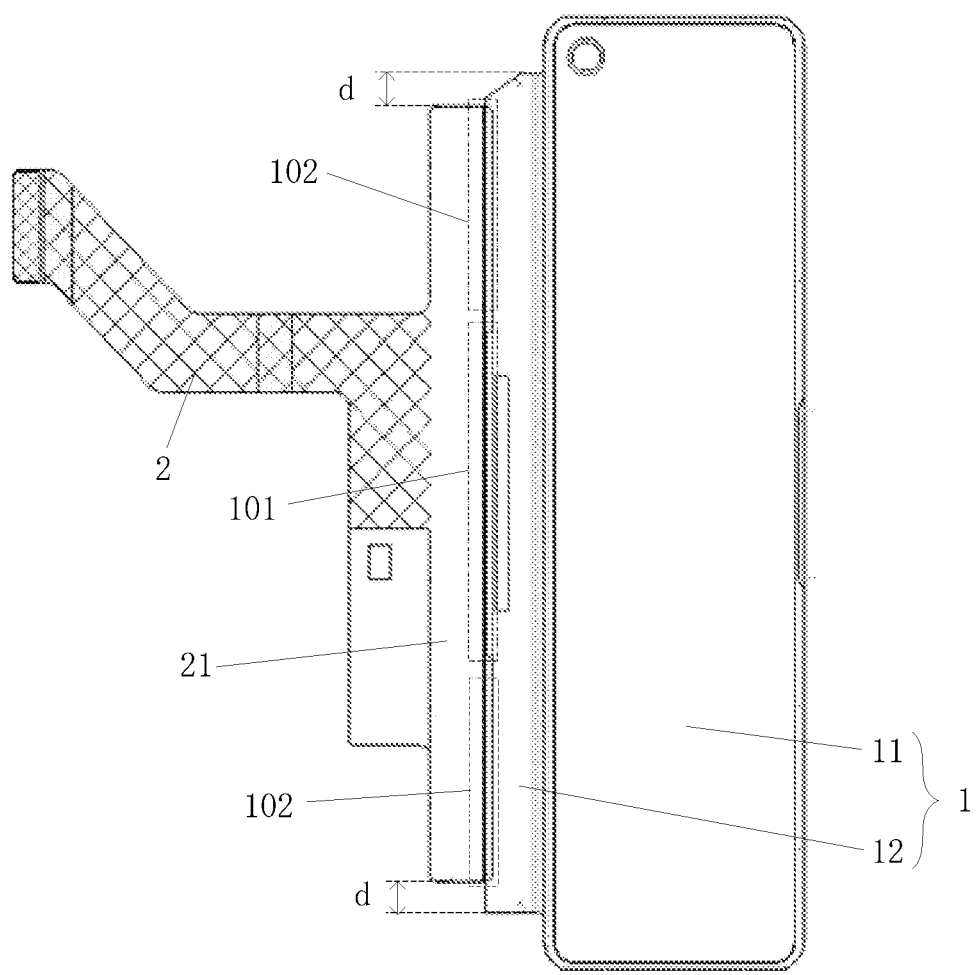
FIG. 1 is a structural schematic diagram of a display device before the bonding portion is bent according to an embodiment of the present disclosure.
Figure 2:
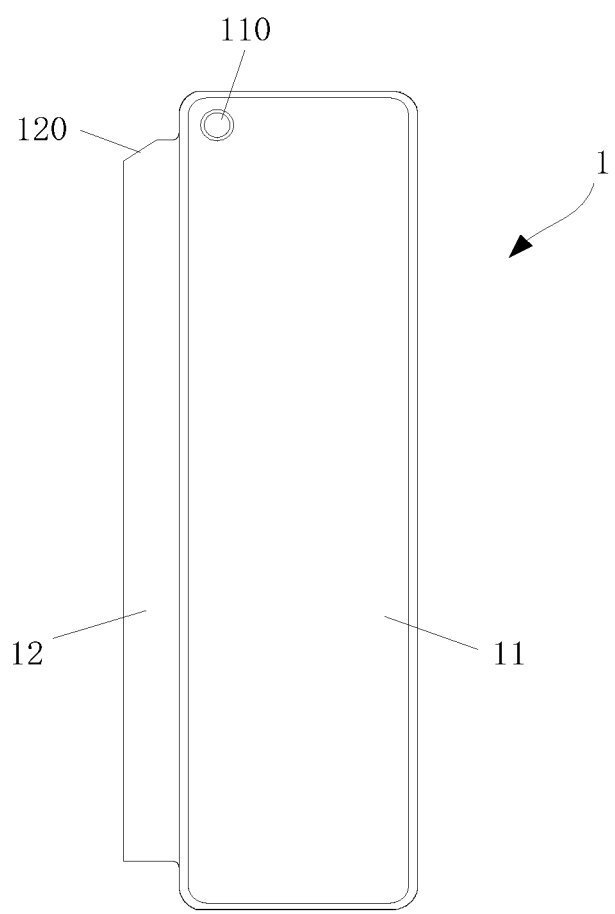
FIG. 2 is a structural schematic diagram of a display module in a display device according to an embodiment of the present disclosure.
Figure 3:
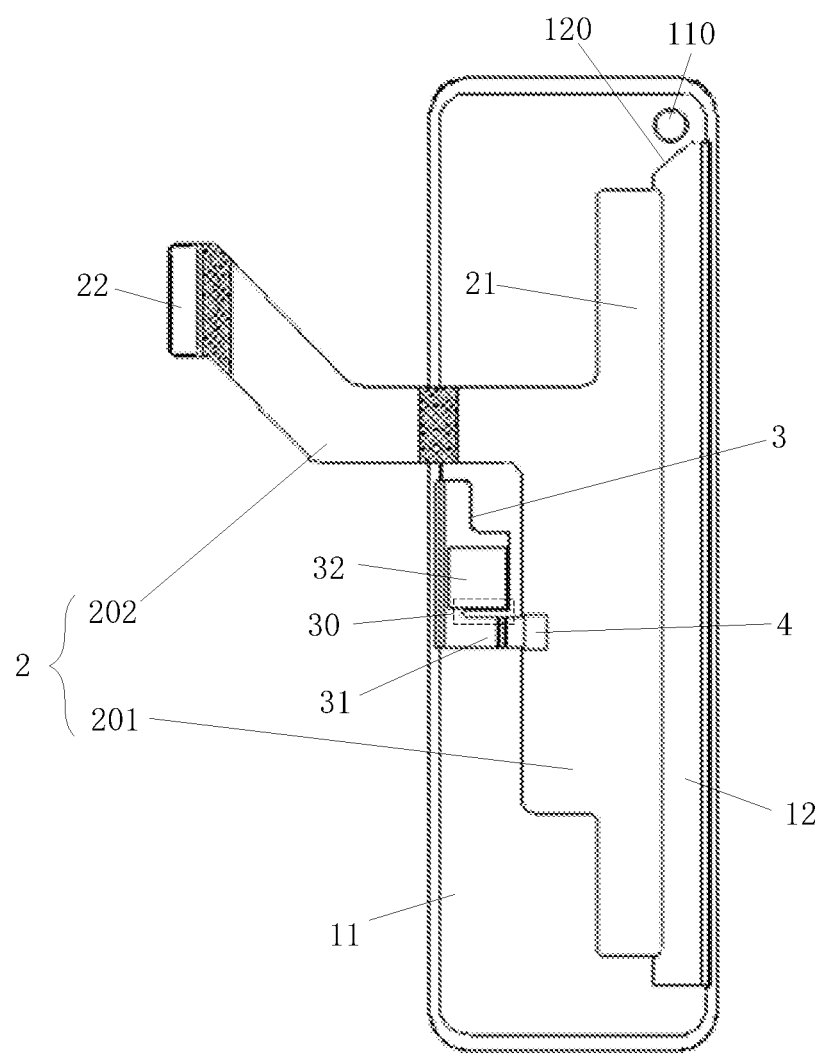
FIG. 3 is a structural schematic diagram of a display device after the bonding portion is bent according to an embodiment of the present disclosure.

As shown in FIGS. 1-3, an embodiment of the present disclosure provides a display device. The display device includes a display module 1 and a first flexible printed circuit 2.

The display module 1 includes a module body 11 and a first bonding portion 12. The first bonding portion 12 is located on a side of a first long edge of the module body 11. The first bonding portion 12 is configured to be bent to a back face of the module body 11.

The first flexible printed circuit 2 is located on the back face of the module body 11. The first flexible printed circuit 2 has a second bonding portion 21. The second bonding portion 21 is fixedly connected to the first bonding portion 12 of the display module 1. The length of the second bonding portion 21 along an extending direction of the first long edge is substantially identical with the length of the first bonding portion 12 along the extending direction of the first long edge.

In some embodiments, a conventional display module has a rectangular shape, and its module body has two opposite long edges and two opposite short edges. In order to meet the demand for extremely narrow lower bezels (short edge bezels), at present, a solution of bonding and pad bending on the long edge is proposed. In the present disclosure, a first long edge is a long edge of the module body for bonding a first flexible printed circuit.

The applicant found that in the related art, a first bonding portion located on one side of a first long edge of a module body extends along the first long edge and has a relatively large length. For conventional flexible printed circuits, the bonding portion for bonding has a relatively small length, which is generally equivalent to the length of the bonding region provided with a connecting terminal in the middle of a first bonding portion, and the bonding portion of the flexible printed circuit is only connected to the bonding region of the first bonding portion in a bonding manner. Further, in the technological process of bending the first bonding portion, the entire first bonding portion is very prone to warping on both sides due to uneven stress, or the deviation occurs due to not high bending quality.

In embodiments of the present disclosure, as shown in FIGS. 1 and 3, the first flexible printed circuit 2 connected to the display module 1 is redesigned, so that the length of the second bonding portion 21 of the first flexible printed circuit 2 along the first long edge direction is matched with the length of the first bonding portion 12 of the display module 1, and the second bonding portion 21 is fixedly connected to the first bonding portion 12 of the display module 1, thereby increasing a stress area during the bending process of the first bonding portion 12 so that two ends of the first bonding portion 12 are also subjected to a stress during the bending process and the first flexible printed circuit 2 directly drives the first bonding portion 12 of the display module 1 to bend. As a result, the display module 1 is not directly subjected to a stress during the bending process, which effectively avoids the problem that two ends of the first bonding portion 12 of the display module 1 are directly subjected to a stress or cannot be subjected to a stress during the bending process. Therefore, it is possible to effectively improve the frequent occurrence of defects such as bending deviation and warping of the bonding portion of the display module 1.

As shown in FIG. 1, in some embodiments, along the extending direction of the first long edge, a distance d between an end part edge of the second bonding portion 21 and a corresponding end part edge of the first bonding portion 12 is less than or equal to 4.5 mm.

Along the extending direction of the first long edge, the length of the second bonding portion 21 is substantially identical with the length of the first bonding portion 12. "Substantially identical" means that a certain error value is allowed, which specifically includes two cases that "two lengths are completely identical" and "two lengths have a small difference value". To be specific, in the present embodiments, the distance between two end part edges of the first bonding portion 12 and the second bonding portion 21 is not greater than 4.5 mm, then the length difference between the first bonding portion 12 and the second bonding portion 21 is not greater than 9 mm, that is, the length difference between the first bonding portion 12 and the second bonding portion 21 ranges from 0-9 mm.

As shown in FIG. 1, in some embodiments, along the extending direction of the first long edge, an end part edge of the first bonding portion 12 and a corresponding end part edge of the second bonding portion 21 are aligned, or an end part edge of the first bonding portion 12 exceeds a corresponding end part edge of the second bonding portion 21.

"The corresponding end part edge" is an end part edge located at the same end. The end part edge of the first bonding portion 12 is aligned with the corresponding end part edge of the second bonding portion 21, that is, the edges of the first bonding portion 12 and the second bonding portion 21 at the same end are aligned. Similarly, the end part edge of the first bonding portion 12 exceeds the corresponding end part edge of the second bonding portion 21, that is, the edges of the first bonding portion 12 and the second bonding portion 21 at the same end are not aligned, where the edge of the first bonding portion 12 exceeds the edge of the second bonding part 21. The arrangement of this embodiment makes the length of the first bonding portion 12 greater than or equal to that of the second bonding portion 21, the end part edge of the second bonding portion 21 does not exceed the end part edge of the first bonding portion 12, thereby preventing the end part edge of the second bonding portion 21 of the first flexible printed circuit 2 from being warped.

As shown in FIG. 1, in some embodiments, the first bonding portion 12 and the second bonding portion 21 are overlapped.

In some embodiments, along the extending direction of the first long edge, overlapped parts of the first bonding portion 12 and the second bonding portion 21 include extension regions 102 located on two ends and a bonding region 101 in the middle, and only the bonding region 101 is provided with a connecting terminal; and the first bonding portion 12 and the second bonding portion 21 are connected in a bonding manner in the bonding region 101.

In other words, although the second bonding portion 21 of the first flexible printed circuit 2 has a larger length, which is equivalent to the length of the first bonding portion 12, only its middle region is provided with a connecting terminal, and only the middle region is electrically connected to the first bonding portion 12.

As shown in FIG. 1, in some embodiments, the display device further includes a conductive rubber layer (not shown in the figure) located between the second bonding portion 21 and the first bonding portion 12 and configured to adhere the overlapped parts of the first bonding portion 12 and the second bonding portion 21.

In some embodiments, a conductive rubber layer can ensure the yield rate of the electrical connection of the bonding region 101 of the first bonding portion 12 and the second bonding portion 21, and can make the extension regions 102 of the first bonding portion 12 and the second bonding portion 21 fixed together, so that the first bonding portion 12 can be bent by the driving of the second bonding portion 21 of the first flexible circuit board 2; and the first bonding portion 12 of the display module 1 does not need to be directly subjected to a stress. During the bending process, both ends of the first bonding portion 12 can also be subjected to a stress, and the overall stress is uniform, which can effectively avoid the high occurrence of undesirable phenomena such as bending deviation and warping of the first bonding portion 12.

As shown in FIGS. 2-3, in some embodiments, the module body 11 has a function hole 110, and the function hole 110 is close to a first end of the first long edge.

In some embodiments, the function hole 110 may be a camera hole or a fingerprint recognition area opening, and is specifically configured to correspond to a functional module such as a camera or a fingerprint sensor.

In some embodiments, the end part edge 120, close to the first end of the first long edge, of the first bonding portion 12 is configured as a wedge-shaped edge avoiding the function hole. Specifically, the wedge-shaped edge specifically refers to the similarly inclined edge caused by the missing corners. The inclined edge may be straight or curved, mainly to avoid the position of the function hole 110.

In some embodiments, the end, close to the function hole 110, of the first bonding portion 12 of the display module 1 may interfere with the function module after the bending process. The end, close to the function hole 110, of the first bonding portion 12 is provided with a wedge-shaped edge to avoid the function hole 110, which can effectively avoid the risk of interference between the first bonding portion 12 and the function module.

In some embodiments, a distance between the wedge-shaped edge and the function hole 110 is greater than or equal to 1 mm.

In actual settings, in the display device of the present disclosure, the function hole formed in the module body may not be formed in one side of the first long edge. For example, the function hole may also be arranged close to the second long edge opposite to the first long edge; or, the module body in the display device of the present disclosure may not be provided with the function hole; these specific implementations all fall into the protection scope of the present disclosure.

As shown in FIG. 3, in some embodiments, the display device further includes a second flexible printed circuit 3. The second flexible printed circuit 3 is connected to the edge of a second long edge of the module body 11 in a bonding manner and configured to be bent to the back face of the module body 11. The second long edge of the module body 11 and the first long edge are disposed oppositely.

In some embodiments, the first flexible printed circuit 2 is a master control flexible printed circuit (MFPC); and the second flexible printed circuit 3 is a touch-control flexible printed circuit (TFPC).

In some embodiments, the display module 1 includes a driving substrate and a counter substrate which are arranged oppositely. A first bonding portion 12 is arranged on one side, close to the first long edge, of the driving substrate and is bent to the side of the driving substrate deviating from the counter substrate (the back face of the module body 11). The first flexible printed circuit (MFPC) 2 is located on the side of the driving substrate deviating from the counter substrate and is connected to the first bonding portion 12 in a bonding manner. The counter substrate is fit into the driving substrate. A bonding portion of a second flexible printed circuit (TFPC) 3 is connected to the edge, close to the side of the second long edge, of the counter substrate in a bonding manner. The other parts of the second flexible printed circuit 3 are bent to the side of the driving substrate deviating from the counter substrate.

In some embodiments, the second flexible printed circuit 3 includes a first connection portion 31. The first connection portion 31 is in inserted connection with the first flexible printed circuit 2 by a connector 4. That is, the second flexible printed circuit 3 is in inserted connection with the first flexible printed circuit 2 on the back face of the module body 11 by the connector 4.

In some embodiments, the module body 11 has a square shape. The second long edge of the module body 11 is opposite to the first long edge, and the distance between the second long edge and the first long edge is shorter as compared with the distance between the two short edges of the module body 11. Therefore, the first connection portion 31 of the second flexible printed circuit 3 may be in inserted connection with the first flexible printed circuit 2 by the connector 4 to realize the electrical signal connection between the second flexible printed circuit 3 and the first flexible printed circuit 2. Furthermore, when performing a lighting test on the display device, there is no need to connect the second flexible printed circuit 3 and the first flexible printed circuit 2 with a test fixture (lighting JIG) by crimping, respectively, and only the second connection portion 22 of the first flexible printed circuit 2 is required to be in inserted connection with the test fixture, which reduces one inserted connection process, effectively reduces inserted connection time and improves test efficiency.

As shown in FIG. 3, in some embodiments, the second flexible printed circuit 3 includes a device portion 32; the second flexible printed circuit 3 is provided with a groove 30 between the device portion 32 and the first connection portion 31, and the groove 30 is configured to separate the device portion 32 from the first connection portion 31.

In some embodiments, the device portion 32 is provided with a meta device. In some embodiments, the device portion 32 has an integrated circuit chip. Of course, the device portion 32 may also have other meta devices such as capacitors.

In some embodiments, the device portion 32 of the second flexible printed circuit 3 and the first connection portion 31 are located on the back face of the module body 11, and the first connection portion 31 is used for being in inserted connection with the first flexible printed circuit 2.

The conventional inserted connection process is generally operated manually with tweezers; since the current conventional flexible printed circuits are all integrated, the device portion and the connection portion are relatively close and connected closely, and the movable area and range of the connection portion are small, so the general inserted connection operation is very inconvenient, and it is easy to cause the tweezers to scratch the meta devices in the device portion and the meta devices on the device portion to peel off. In the present disclosure, as shown in FIG. 3, a groove 30 is formed between the device portion 32 and the first connection portion 31 of the second flexible printed circuit 3, and the groove 30 separates the device portion 32 from the first connection portion 31. The amplitude and range of the inserted connection movement of the first connection portion 31 can be improved. In this way, when the inserted connection operation is performed manually with tweezers, the device portion 32 can be firstly bonded to the module body 11, and only the tweezers are used to operate the first connection portion 31. Since the first connection portion 31 and the device portion 32 are separated, the movement of the first connection portion 31 will not involve the device portion 32, thereby effectively improving the inserted connection efficiency and preventing the meta devices from the risk of peeling off and being scratched.

As shown in FIG. 3, in some embodiments, the first flexible printed circuit 2 is L-shaped or T-shaped and has a first extension portion 201 and a second extension portion 202; the first extension portion 201 extends along the first long edge of the module body 11 and is connected to the first bonding portion 12; one end of the second extension portion 202 is connected to the first extension portion 201 and the other end extends in a direction away from the first extension portion 201.

It should be noted that the "L-shaped or T-shaped" mentioned in the present disclosure mainly means that the first flexible printed circuit 2 has two portions (the first extension portion 201 and the second extension portion 202) extending in two directions, respectively. The extending direction of the two portions is substantially perpendicular, but the overall shape is not necessarily strictly "L-shaped or T-shaped"; specifically, for example, the specific width and length of the two portions are not limited, and each portion is not necessarily linear and not necessarily a symmetrical figure; for example, the width of the first extension portion 201 and/or the second extension portion 202 in the extending direction may not be even and consistent, or the first extension portion 201 and/or the second extension portion 202 may also extend in a bending manner.

In some embodiments, the second flexible printed circuit 3 is located between the first extension portion 201 and the second extension portion 202, that is, the second flexible printed circuit 3 is located in an area enclosed by the first extension portion 201 and the second extension portion 202 of the first flexible printed circuit 2. The device portion 32 and the first connection portion 31 of the second flexible printed circuit 3 are arranged and adjacent along the extending direction of the second long edge, where the first connection portion 31 is in inserted connection with the first extension portion 201 of the first flexible printed circuit 2; at this moment, the groove 30 between the device portion 32 and the first connection portion 31 of the second flexible printed circuit 3 is a U-shaped through-groove with an opening departing from the second long edge. In other words, the open end of the U-shaped through-groove faces the first extension portion 201 of the first flexible printed circuit 2, and the other end is not open to ensure that the second flexible printed circuit 3 is still a continuous whole.

As shown in FIG. 3, in some embodiments, the first flexible printed circuit 2 is L-shaped or T-shaped; one end of the second extension portion 202 of the flexible printed circuit 2 is connected to the first extension portion 201, and the other end extends in a direction away from the first extension portion 201; moreover, one end, away from the first extension portion 201, of the second extension portion 202 is configured as a second connection portion 22, and the second connection portion 22 exceeds the second long edge of the module body 11 and is electrically connected (inserted connection) to a test fixture.

In some embodiments, the second connection portion 22 extends beyond the second long edge of the module body 11, which can facilitate the inserted connection operation with the test fixture, and effectively improve the inserted connection test efficiency. In addition, when assembling the whole machine, the second connection portion 22 can be bent to the back face of the module body 11, so that all portions of the first flexible printed circuit 2 are located on the back face of the module body 11 without affecting the whole machine assembly and product shape.

Further, as shown in FIG. 2, the present disclosure further provides a display device which includes: a display module 1 having a module body 11 and a first bonding portion 12 located on one side of a first long edge of the module body 11, where the first bonding portion 12 is configured to be bent to the back face of the module body 11; the module body 11 has a function hole 110, and the function hole 110 is close to a first end of the first long edge; the end part edge 120, close to the first end of the first long edge, of the first bonding portion 12 is configured as a wedge-shaped edge avoiding the function hole.

In some embodiments, for specific embodiments of the display module provided in the embodiments of the present disclosure, refer to the embodiments of the display module in the foregoing embodiments, and details are not repeated here.

Further, as shown in FIG. 3, the present disclosure further provides a display device which includes: a display module 1 having a module body 11 and a first bonding portion 12 located on one side of a first long edge of the module body 11, where the first bonding portion 12 is configured to be bent to the back face of the module body 11; a first flexible printed circuit 2 located on the back face of the module body 11, where the first flexible printed circuit 2 has a second bonding portion 21, and the second bonding portion 21 is fixedly connected to the first bonding portion 12 of the display module 1; and a second flexible printed circuit 3 connected to the edge of a second long edge of the module body 11 in a bonding manner and configured to be bent to the back face of the module body 11; where the second long edge of the module body 11 and the first long edge are disposed oppositely; where the second flexible printed circuit 3 includes a first connection portion 31 and a device portion 32, and the first connection portion 31 is in inserted connection with the first flexible printed circuit 2 by a connector 4; the second flexible printed circuit 3 is provided with a groove 30 between the device portion 32 and the first connection portion 31, and the groove 30 is configured to separate the device portion 32 from the first connection portion 31.

In some embodiments, for specific embodiments of the display module provided in the embodiments of the present disclosure, refer to the embodiments of the display module in the foregoing embodiments, and details are not repeated here.

In some embodiments, the display device provided by the present disclosure may be an AMOLED display device.

In some embodiments, the display device provided by the present disclosure may be applied to display devices such as tablet computers and mobile phones.

It should be noted that in some embodiments of the present disclosure, the display device may also include other structures, which may be determined according to actual requirements, and the embodiments of the present disclosure do not limit this. In addition, the size and shape of each structure provided by the embodiments of the present disclosure are not limited to the above-mentioned embodiments, as long as the basic requirements of the structure are met during actual settings, for details, refer to the above description, which will not be repeated here. Furthermore, the drawings of the present disclosure are only schematic diagrams, and the sizes and proportions of the structures of various portions in the figures do not represent the actual size and proportions of the structures.

Although the preferred embodiments of the present disclosure have been described, those skilled in the art can make additional changes and modifications to these embodiments once they learn the basic concept of inventiveness. Therefore, the appended claims are intended to be interpreted as including the preferred embodiments and all changes and modifications falling within the scope of the present disclosure.

It is apparent that those skilled in the art can make various modifications and variations to the embodiments of the present disclosure without departing from the spirit and scope of the present disclosure. In this way, all such modifications and variations are intended to be included within the scope of the present disclosure if these modifications and variations of the embodiments of the present disclosure fall into the scope of the claims of the present disclosure and their equivalent technologies.

What is claimed is:

1. A display device, comprising:
    a display module, comprising a module body and a first bonding portion located on a side of a first long edge of the module body, wherein the first bonding portion is bent to a back face of the module body; and
    a first flexible printed circuit, located on the back face of the module body, wherein the first flexible printed circuit comprises a second bonding portion, and the second bonding portion is fixedly connected to the first bonding portion of the display module; and a length of the second bonding portion along an extending direction of the first long edge is substantially identical with a length of the first bonding portion along the extending direction of the first long edge;
    wherein, the first bonding portion and the second bonding portion are overlapped;
    along the extending direction of the first long edge, overlapped parts of the first bonding portion and the second bonding portion comprise extension regions located on two ends and a bonding region in the middle, and only the bonding region is provided with a connecting terminal; and the first bonding portion and the second bonding portion are connected in a bonding manner in the bonding region.

2. The display device according to claim 1, wherein, along the extending direction of the first long edge, a distance between an end part edge of the second bonding portion and a corresponding end part edge of the first bonding portion is less than or equal to 4.5 mm.

3. The display device according to claim 2, wherein, along the extending direction of the first long edge,
    an end part edge of the first bonding portion and a corresponding end part edge of the second bonding portion are aligned, or
    an end part edge of the first bonding portion exceeds a corresponding end part edge of the second bonding portion.

4. The display device according to claim 1, further comprising:
    a conductive rubber layer located between the second bonding portion and the first bonding portion and configured to adhere the overlapped parts of the first bonding portion and the second bonding portion.

5. The display device according to claim 1, wherein, the module body comprises a function hole, and the function hole is close to a first end of the first long edge; and
    an end part edge, close to the first end of the first long edge, of the first bonding portion is configured as a wedge-shaped edge avoiding the function hole.

6. The display device according to claim 5, wherein, a distance between the wedge-shaped edge and the function hole is greater than or equal to 1 mm.

7. The display device according to claim 1, further comprising:
    a second flexible printed circuit connected to an edge of a second long edge of the module body in a bonding manner and configured to be bent to the back face of the module body; wherein the second long edge of the module body and the first long edge are disposed oppositely;
    the second flexible printed circuit comprises a first connection portion, and the first connection portion is in inserted connection with the first flexible printed circuit by a connector.

8. The display device according to claim 7, wherein, the second flexible printed circuit further comprises a device portion;
    the second flexible printed circuit is provided with a groove between the device portion and the first connection portion, and the groove is configured to separate the device portion from the first connection portion.

9. The display device according to claim 8, wherein, the device portion comprises an integrated circuit chip.

10. The display device according to claim 8, wherein, the first flexible printed circuit is L-shaped or T-shaped and comprises a first extension portion and a second extension portion; the first extension portion extends along the first long edge of the module body and is connected to the first bonding portion; one end of the second extension portion is connected to the first extension portion and the other end extends in a direction away from the first extension portion; and the second flexible printed circuit is located between the first extension portion and the second extension portion, the device portion and the first connection portion are arranged and adjacent along an extending direction of the second long edge, and the first connection portion is in inserted connection with the first extension portion; and the groove is a U-shaped through-groove with an opening departing from the second long edge.

11. The display device according to claim 7, wherein, the first flexible printed circuit is a master control flexible printed circuit; and the second flexible printed circuit is a touch-control flexible printed circuit.

12. The display device according to claim 1, wherein, the first flexible printed circuit is L-shaped or T-shaped, and comprises a first extension portion and a second extension portion; the first extension portion extends along the first long edge of the module body and is connected to the first bonding portion; one end of the second extension portion is connected to the first extension portion, and the other end extends in a direction away from the first extension portion; and one end, away from the first extension portion, of the second extension portion is configured as a second connection portion, and the second connection portion exceeds a second long edge of the module body and is electrically connected to a test fixture; and the second long edge of the module body and the first long edge are oppositely disposed.

\* \* \* \* \*